(12) United States Patent
Walley et al.

(10) Patent No.: US 6,421,283 B1
(45) Date of Patent: Jul. 16, 2002

(54) TRAP AND PATCH SYSTEM FOR VIRTUAL REPLACEMENT OF DEFECTIVE VOLATILE MEMORY CELLS

(75) Inventors: John S. Walley, Portola Hills; Dong Cho, Pomona, both of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/671,401

(22) Filed: Sep. 27, 2000

(51) Int. Cl.[7] .................................................. G11C 7/00
(52) U.S. Cl. ........................ 365/200; 365/201; 714/710; 714/711
(58) Field of Search ................................. 365/200, 201; 714/710, 711

(56) References Cited

U.S. PATENT DOCUMENTS

| | | | | |
|---|---|---|---|---|
| 5,758,056 A | * | 5/1998 | Barr | 395/182.05 |
| 5,986,952 A | * | 11/1999 | McConnell et al. | 365/200 |
| 6,141,768 A | * | 10/2000 | Lin et al. | 714/8 |
| 6,198,663 B1 | * | 3/2001 | Takizawa | 365/185.29 |

\* cited by examiner

Primary Examiner—David Nelms
Assistant Examiner—Connie C. Yoha
(74) Attorney, Agent, or Firm—Greer, Burns & Crain, Ltd.

(57) ABSTRACT

A typical integrated circuit device may include a central processing unit (CPU), trap and patch (T&P) logic circuits and registers. Volatile RAM and read only memory (ROM) are also provided. A predetermined number of memory locations in the RAM are allocated for defective memory cell replacement. When power is turned on or the system is reset, the CPU executes a program stored in ROM which identifies defective RAM locations on the fly and loads the trap and path circuits and registers with the defective addresses and the replacement or patch RAM locations (addresses). When the CPU reads or writes to the bad RAM locations, the T&P logic inserts the patch address of the good RAM memory location for the reading and writing operations. In this manner, virtual defective RAM replacement is transparent to the CPU.

9 Claims, 6 Drawing Sheets

TRAP AND PATCH SYSTEM FOR VIRTUAL REPLACEMENT OF DEFECTIVE VOLATILE MEMORY CELLS

BACKGROUND OF THE INVENTION

1. Field of the Invention

This invention relates to volatile memory devices such as Random Access Memories (RAM), and more particularly, to systems for identifying defective RAM memory cells and virtually replacing the defective cells with operable memory cells.

2. Related Art

Very large scale integrated circuit devices (VLSI), such as application specific integrated circuits (ASIC's), are continually increasing in size, and the volatile memory (RAM) in such devices is also increasing. Larger devices generally have a lower yield due to the large number of components and connections that are on each circuit chip. The lower yield can increase cost significantly. If even one memory cell (bit) of RAM is defective, an entire device can potentially be rejected and lost.

Several techniques have been developed to address this problem. For example, redundancy has been added to improve the ability of the system to operate with a few bit errors. In such devices, extra memory cells called redundant cells are made when the device is fabricated. The redundant cells are used to replace defective cells by changing the circuit connections after the device is tested. This is another step in the fabrication process. However, this solution requires extra memory cells, that adds to cost. The resources required to rewire the device also increase cost.

Another known solution is to increase the RAM word width from perhaps 8 bits to 9–10 bits, and add parity bit(s) detection to identify defects through a parity check. Then, a software RAM table can be adjusted to avoid the bad cells. However, this requires an extra memory for the parity bits, which is undesirable due to cost.

Defective software code replacement in read only memory (ROM) has been accomplished using a "trap and patch" approach to code replacement. In the trap and patch method, logic is used to replace one or more lines of code stored in ROM with lines of code stored in RAM, in a way that is transparent to the central processing unit (CPU).

Figure 1:
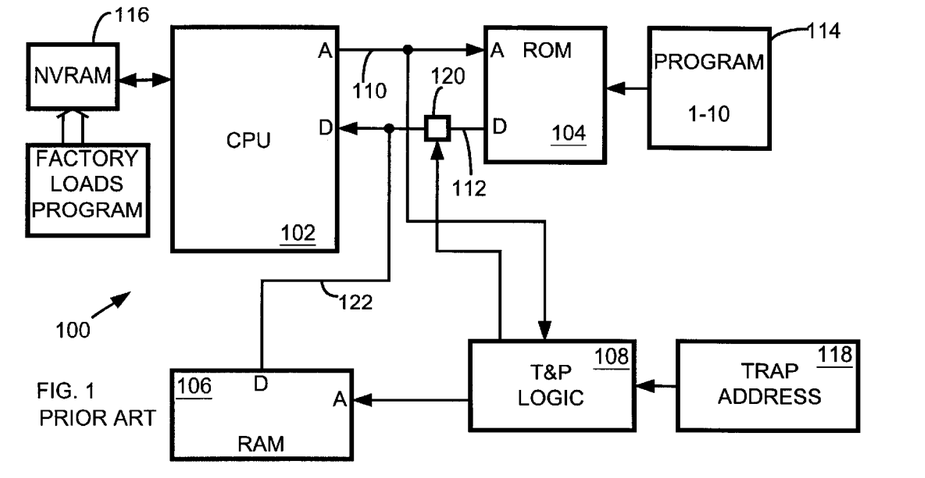
FIG. 1 is a block diagram of a prior art circuit used to replace defective ROM code.

An example of trap and patch code replacement in ROM is seen in FIG. 1. An application specific integrated circuit (ASIC) or other integrated circuit 600 may include a CPU 302, ROM 304, RAM 106 and trap and patch (T&P) logic 308. As the CPU 302 runs, it sends address requests on an address line 310 to the ROM 304, and data is returned on a data line 112. The ROM 304 might contain a program having steps 1–10, as seen in FIG. 2.

If some of the code stored in the ROM is defective or out-dated, trap and patch code (developed in the factory to replace the unwanted code) is stored in a nonvolatile RAM (NVRAM) 316. When the unit is powered up or reset (PoR), the NV RAM 316 loads the trap and patch software in the RAM 106, and loads trap addresses 118 in the T&P logic 308. The T&P logic 308 cuts off the data output of the ROM 304 in a gate 320 when a trap address is recognized, and sends the replacement code stored in the RAM 106 to the CPU over a line 322.

This process might only be needed at power on/reset, since the CPU can then normally run from RAM if instructed to "jump" execution to the RAM address. Code execution redirection can be accomplished in other ways, such as through a special CPU interrupt that instantaneously changes code source.

Figure 2:
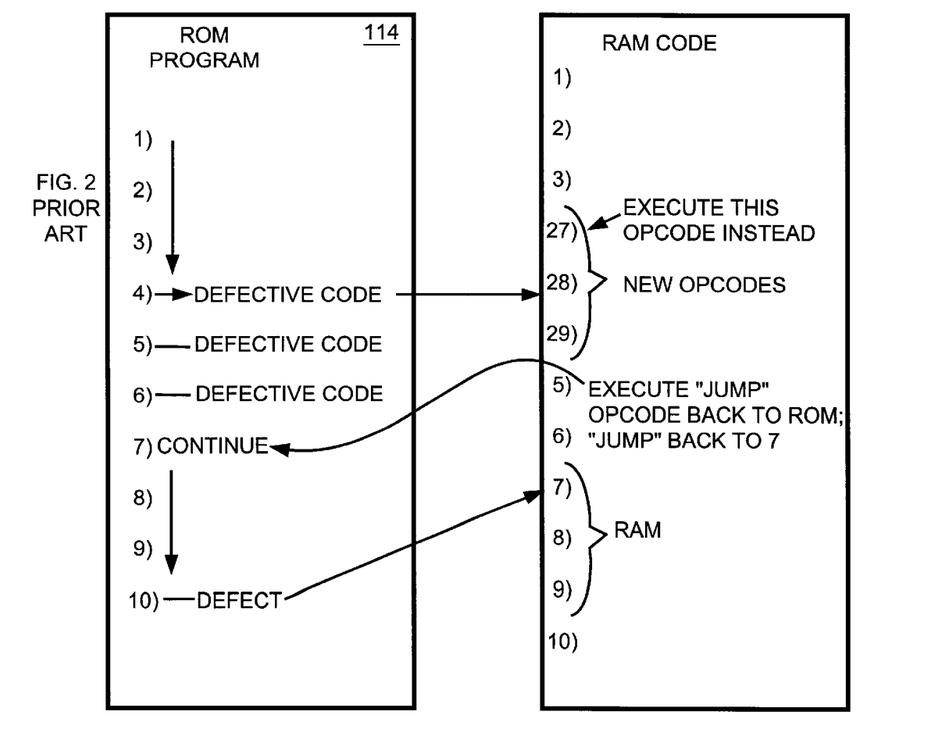
FIG. 2 is a flow diagram illustrating the operation of the circuit of FIG. 1.

For example, if steps 4, 5 and 6 in the program 114 are defective, the factory programs the NV RAM 316 so that the trap and patch logic 308 detects 3 on the address line 310, closes the gate 320, and replaces the bad code with steps 27, 28 and 29 in patch code stored in the RAM 106 (FIG. 2). In this manner, the defective code for steps 4, 5 and 6 is replaced with steps 27, 28 and 29, after which gate 320 opens and the routine is returned to step 7 in the program 114. A defect in step 10 can be replaced with perhaps lines 7, 8 and 9 of RAM code in a similar manner. In this manner, the defective code is replaced in a manner that is transparent to the CPU.

While the trap and patch method has been successfully used to replace code stored in ROM, the concept has not been applied to RAM. Thus, there is still a need for a system capable of replacing defective RAM memory cells, to increase manufacturing yields and decrease cost. Conventional ROM trap and patch systems rely on the factory to identify defective code, so if even one ROM memory cell is lost in the field, the system cannot recover and usually fails. Thus, there is also a need for trap and patch methods which identify and virtually replace defective memory cells on the fly.

SUMMARY

An integrated circuit device may include a central processing unit (CPU), volatile RAM and read only memory (ROM). Trap and patch (T&P) logic circuits and a plurality of trap and patch registers may also be provided. The volatile RAM, that can include one or more physical memories, may have a number of memory cells that are allocated for operation of the device, and a number of other memory cells that are allocated for virtual defective memory cell replacement.

When the device is manufactured, the entire RAM is tested by a program on the device or on a tester, to identify bad memory locations. If the total number of RAM errors in the memory cells for device operation is greater than the number of trap and patch logic circuits and registers, or if RAM used for diagnostic program execution is bad, the device is rejected. If not, the device can be used.

When power is turned on or the system is reset (PoR), the CPU executes a diagnostic program stored in ROM that identifies defective RAM memory locations among the memory cells used for operating purposes. The CPU then loads the T&P logic and trap registers with the defective addresses and the replacement or patch RAM locations (addresses). When the CPU reads or writes to the bad RAM locations, the T&P logic cuts off access to the RAM and inserts the patch addresses of the replacement RAM memory locations for the reading and writing operations. This virtual memory cell replacement is transparent to the CPU. Since the diagnostic program is run on every PoR, cells which become defective in the field can be identified and replaced, averting a system failure.

In another embodiment of the invention, the defective memory locations and trap addresses are stored in nonvolatile random access memory (NV RAM) at the factory or by the embedded diagnostic program. Once stored in NV RAM, the trap and patch address information can be loaded more quickly.

Other systems, methods, and features of the invention will be apparent to one with skill in the art upon examination of the following figures and detailed description. It is intended that all such additional systems, methods and features be included within this description, be within the scope of the invention, and be protected by the accompanying claims.

DESCRIPTION OF THE FIGURES

The components in the figures are not necessarily to scale, emphasis instead being placed upon illustrating the principles of the invention. Moreover, in the figures, like reference numerals designate corresponding parts throughout the different views.

DETAILED DESCRIPTION

Figure 3:
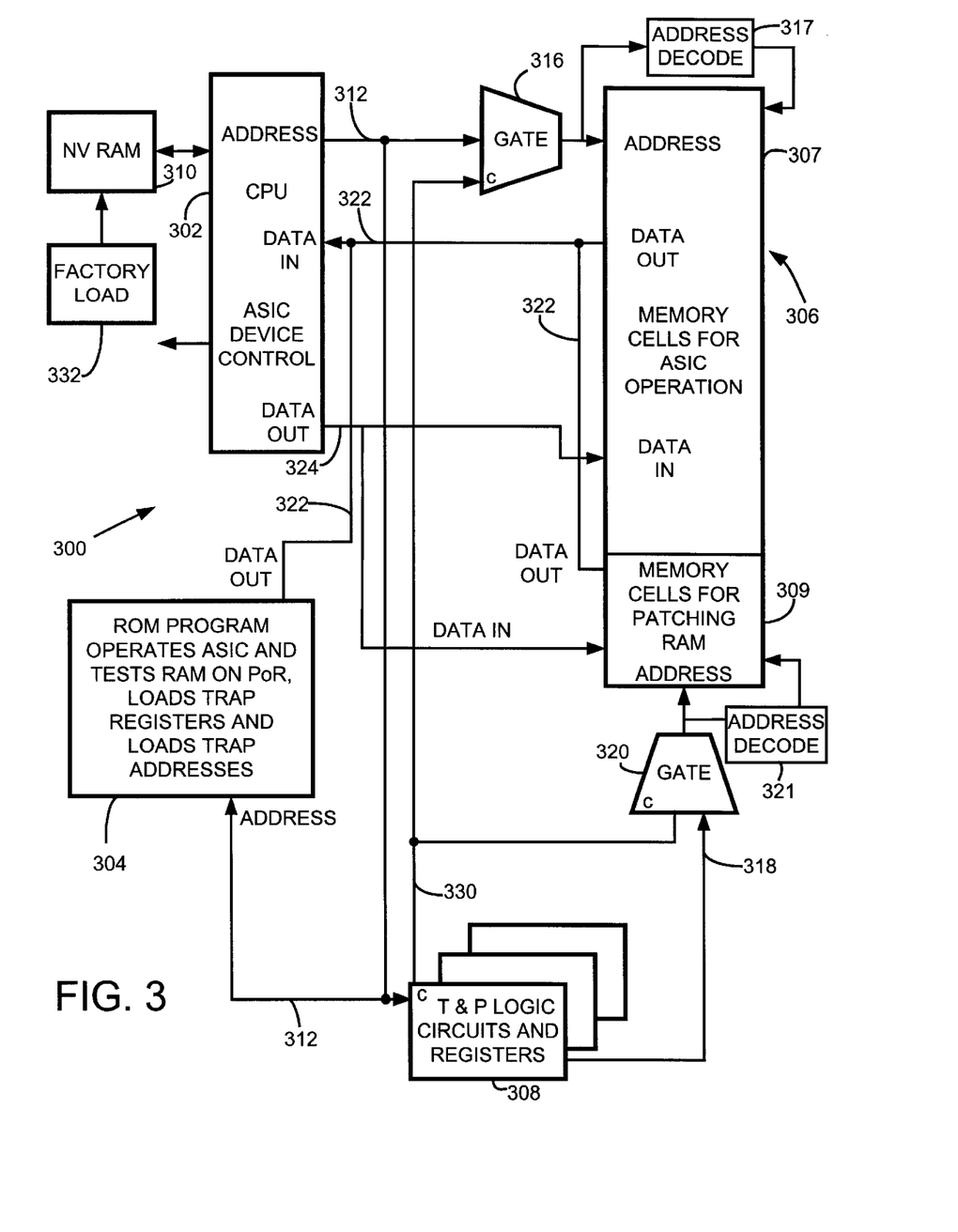
FIG. 3 is a block diagram of a circuit for identifying and replacing defective RAM memory cells.

Referring to FIG. 3, a VLSI 300 such as an ASIC, Field Programmable Gate Array, Programmable Logic Device or the like includes a CPU 302, a Read Only Memory (ROM) 304 and Random Access Memory (RAM) 306. The device 300 also includes trap and patch logic circuits and registers 308. Other components, such as a nonvolatile RAM (NV RAM) 310 can also be provided, as needed.

Physically, the RAM 306 includes a plurality of memory locations that can be located anywhere on the device. Logically, the RAM 306 includes a plurality of memory locations 307 that are used for normal operation of the device 300, and a plurality of memory locations 309 that are dedicated for RAM replacement of defective operation memory cells. For ease of understanding, the memory locations 309 are shown as being separate from the memory locations 309 in FIG. 3, with separate data and address ports, but it is not necessary to separate the RAM in this manner.

An address bus 312 sends address information from the CPU 302 to the RAM 307 through a gate 316. An address decoder 317 enables the RAM 307 when an address is in the RAM 307. Address information is also sent to the T&P logic circuits 308 and the ROM 304. Address information is sent to the RAM 309 from the T&P circuits and registers 308 through a bus 318 and gate 320. An address decoder 321 enables the RAM 309 when an address is in the RAM 309.

The CPU 302 receives data through a bus 322. The data can be sent by the RAM 307, RAM 309, or the ROM 304. Data is output from the CPU 302 over a data bus 324, and is sent to the RAM 309 to the RAM 307 and the T&P logic circuits 308. The trap and patch logic circuits 308 control the gates 316 and 320 through a bus 330.

Figure 4:
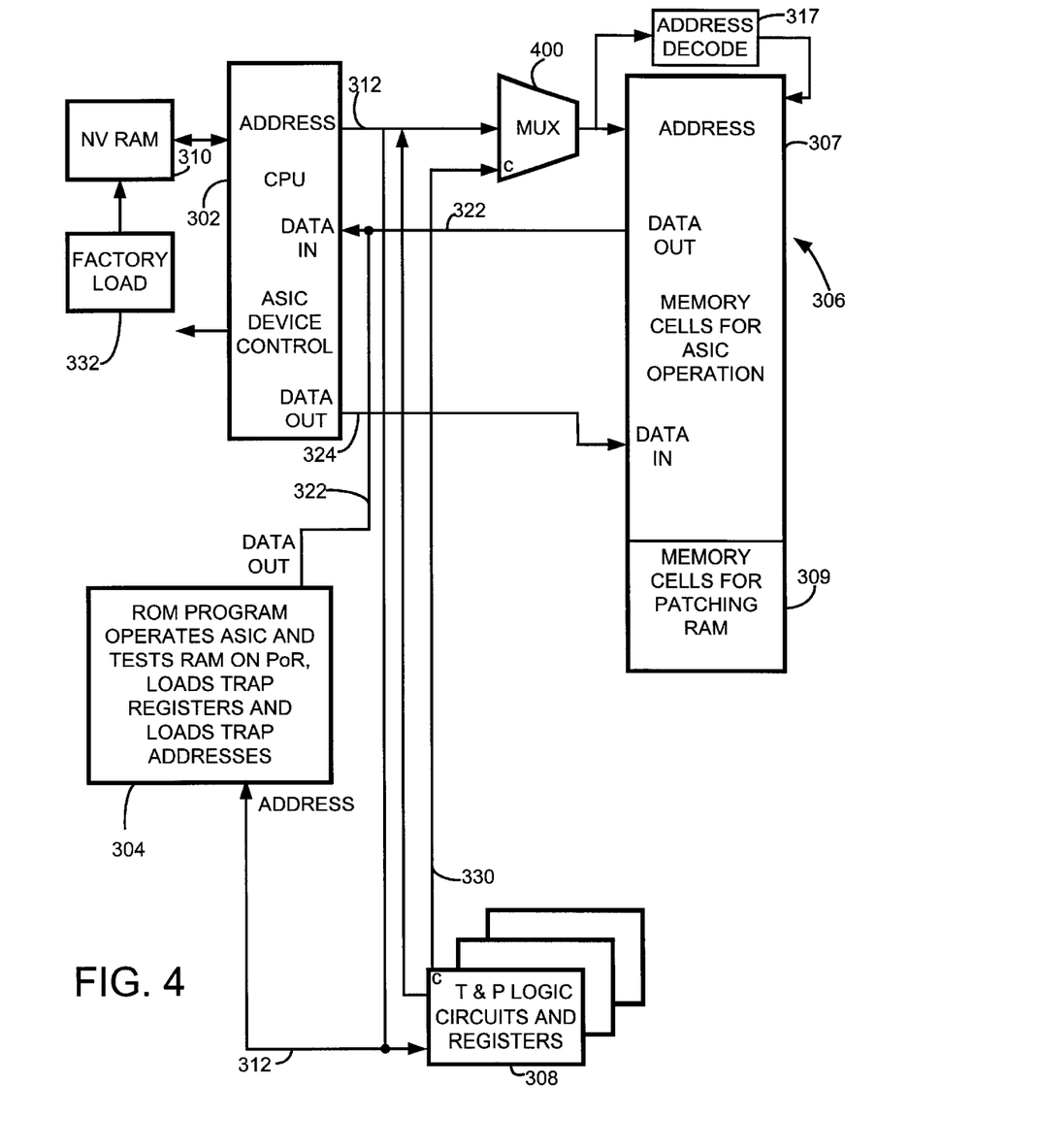
FIG. 4 is a block diagram of another circuit for identifying and replacing defective memory cells.

While the RAM memory cells 307 and 309 are logically separate from each other, they need not be physically separate, as in FIG. 4. If all of the cells are in a single physical memory, the gates 316 and 320 can take the form of a multiplexer 300 that would selectively choose an address from the CPU 302 or the T&P registers 308. In this configuration, the gates 316 and 320 and the address decoder 321 are not needed. Many such or similar memory configurations will be apparent to those skilled in the art.

Figure 5:
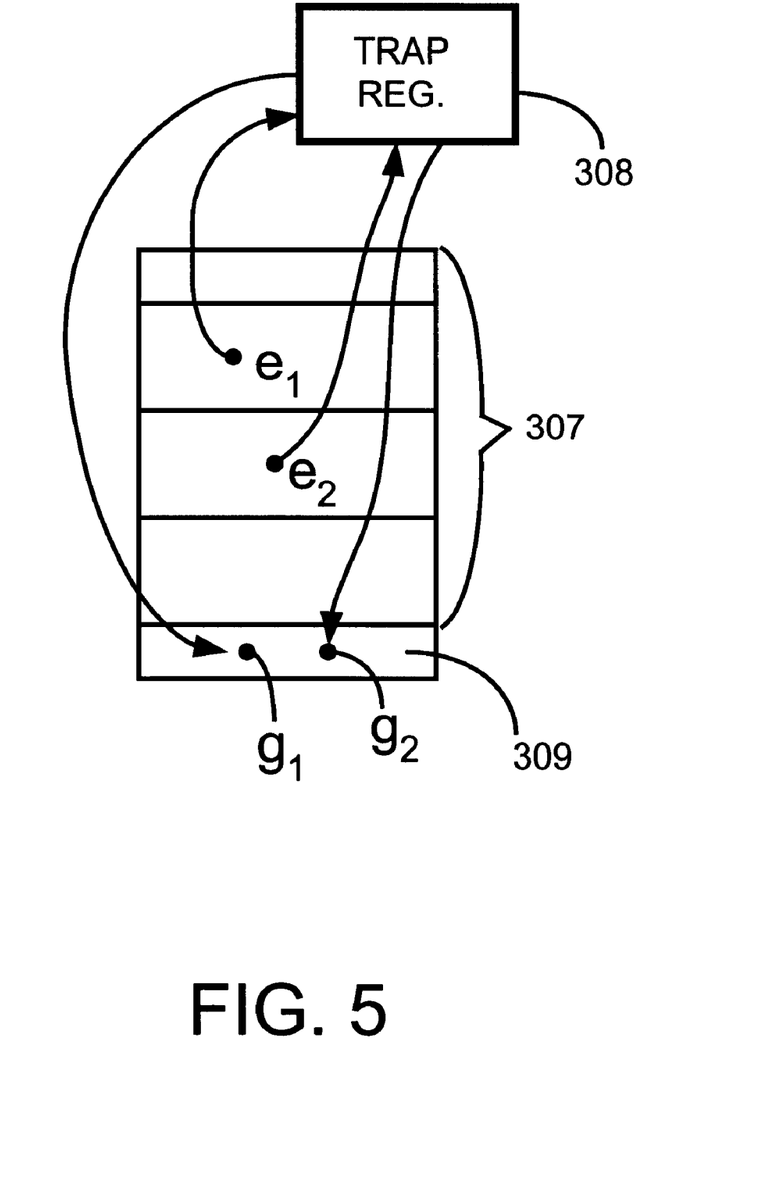
FIG. 5 is an explanatory diagram defective RAM memory cell replacement.

Generally, the invention virtually replaces defective RAM memory locations, such as cells $e_1$ and $e_2$ in FIG. 5, with good memory cells $g_1, g_2$ provided in the replacement RAM memory cells 309. This is accomplished through the trap registers 308, which re-direct addressed accessed by the CPU to the good memory cells. Memory cell replacement is transparent to the CPU, and is done on the fly during operation.

Figure 6:
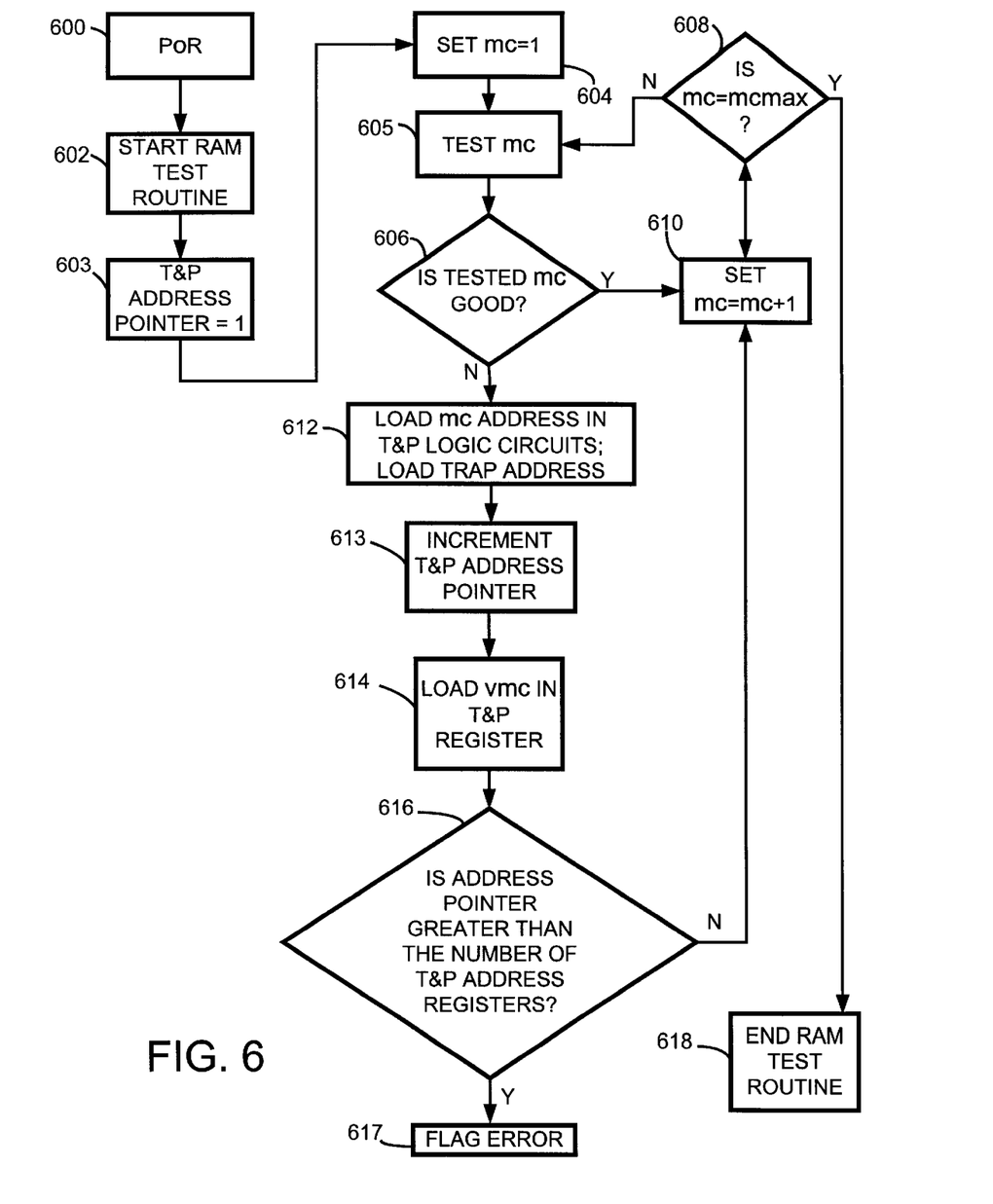
FIG. 6 is a flow chart of a program used to identify defective RAM memory cells and designate patch memory cells for replacement of the defective cells.

Defective memory cells can be identified using the routine shown in FIG. 6, or a similar routine. On power on or reset (PoR) 600, the ROM 304 starts a RAM test routine 602, beginning with a predetermined memory cell (mc) at 604. If the memory cell is good, mc is incremented to the next memory cell at 608, and that memory cell is tested. The process is repeated until the last memory cell (mcmax) has been tested 610. If a memory cell (mc) is found to be defective in step 606, the address of that cell is loaded in a T&P logic circuit 308 at step 612. A memory cell in the RAM 307 is selected for virtual replacement, and its address is loaded in the T&P register which corresponds to the selected logic circuit 308 at 614. A suitable subroutine can be provided at 616 to indicate a fatal error 617 if all of the logic circuits are used at that point.

If all of the T&P registers have not been used at 616, mc is incremented at 610 and testing continues unless mc+mcmax. If all of the cells have been tested at 610, the RAM test routine ends at 618.

Figure 7:
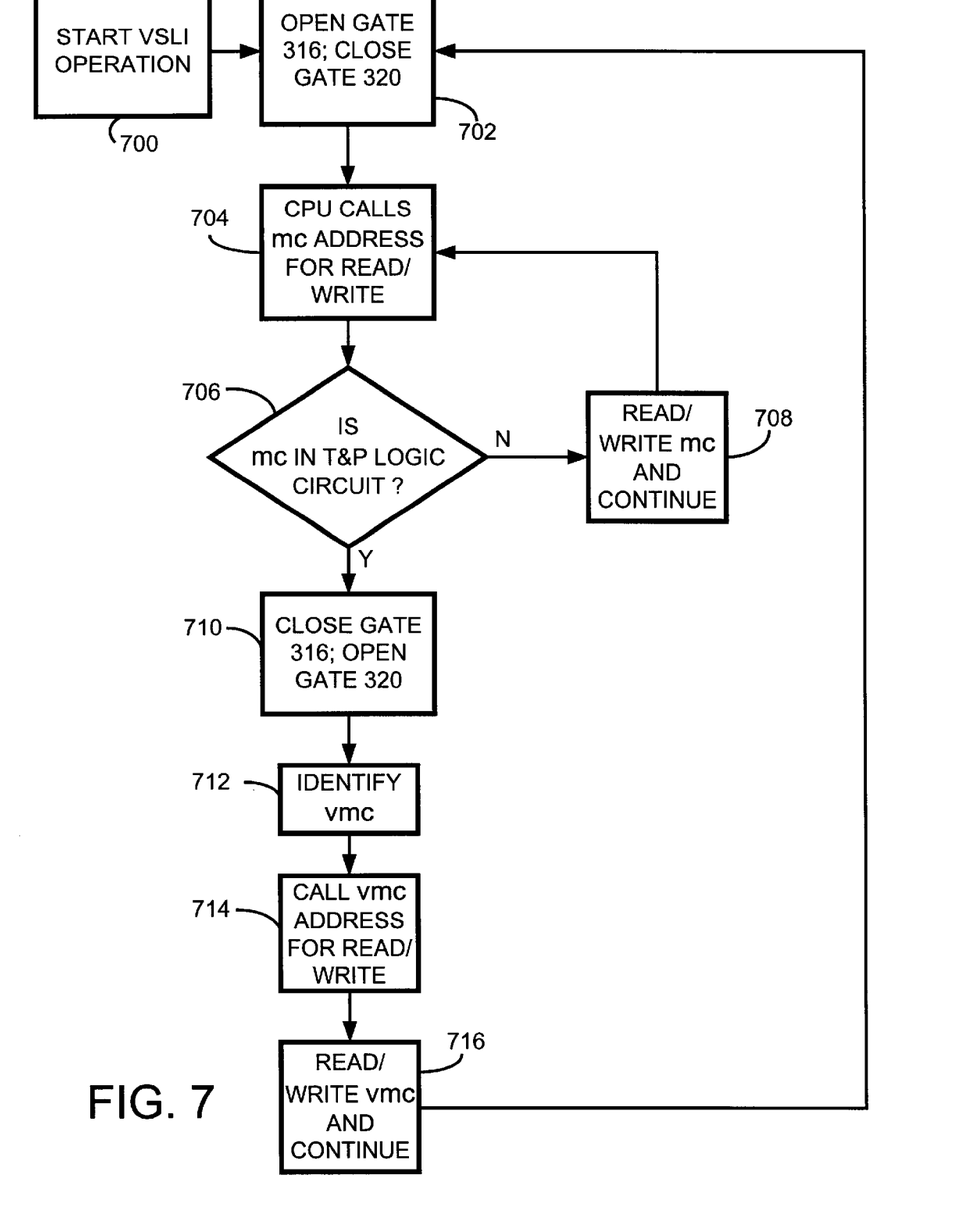
FIG. 7 is a flow chart of a program used to replace defective RAM memory cells during operation of the device of FIG. 3.

Referring to FIG. 7, ROM 304 can cause the CPU to begin basic operation of the ASIC VLSI 300 at 700 and the device the VLSI controls when the RAM test routine is finished. Initially, the gate 316 is opened, and the gate 320 is closed 702. Each time the CPU 302 sends a memory cell address on the bus 312 at 704, the address is sent to the T&P logic circuits 308. If the address is not found in the T&P logic circuits 308 at 706, the address request passes through the gate 316, and is processed in the RAM 307 at 708. The address decoder 317 enables the RAM 307 for this processing.

If an addressed memory cell is found in the T&P logic circuits 308 at 706, then the gate 316 is closed, and the gate 320 is opened at 610. The virtual memory cell (vmc) stored in the appropriate trap register in the logic circuits and registers 308 is identified at 712, and the address of the designated virtual memory cell is called for the read/write operation 514. The address decoder 321 enables the RAM 309 at that time. If the operation is a write operation, the data is accepted 726, and if the operation is a read operation, the data is read out to the bus 322. The routine then returns to step 702, and processing continues. In this manner, the substitution of a virtual memory cell for the actual memory cell is transparent to the CPU 302.

Of course, the factory initially tests the device 100 in its entirety, including the entire RAM 107 and 309. If defective cells are found in the RAM 309 used for the program that tests the RAM, or if the defective cells in RAM 107 exceed the number of circuits in the T&P logic circuits 308, the device cannot be used. Otherwise, the device 100 can be used notwithstanding the defective cells in the RAM 107.

If desired, the factory can load the defective memory cell locations in the NV RAM 310 (See 332 in FIG. 1). Moreover, when the ROM 304 runs its test routine, the CPU 302 can store that information in the NV RAM 310. Then, during operation, the RAM testing routine can be performed only occasionally, as desired. In this manner, the information stored in the NV RAM 310 can be used to shorten the time required for the RAM test. In any event, any time the test routine is run, defective memory cells will be identified in the field.

While the various embodiments of the application have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A method for identifying and replacing defective memory cells in a random access memory device in an integrated circuit device that also has a central processing unit and a read only memory, comprising:

testing each memory cell in a plurality of operation cells which are provided for normal operation of the device, testing all memory cells in a plurality of patch memory cells provided for defective cell replacement, and providing a program in the read only memory that is used to identify defective operation cells and designate selected patch memory cells as virtual replacements for tie defective operation cells, each time the random access memory device is turned on or reset, wherein the defective operation cells have addresses which are stored in trap and patch (T&P) logic circuits, the virtual replacements for the defective operate cells having addresses which are stored in associated T&P registers.

2. The method of claim 1 comprising:

rejecting the integrated circuit device if the number of defective operation cells exceeds a predetermined number.

3. The method of claim 1 comprising:

rejecting the integrated circuit device if any patch memory cells are defective.

4. A method for operating an application specific integrated circuit device having a central processing unit (CPU), a plurality of random access memory (RAM) cells, and programmed read only memory (ROM), comprising, applying power to the device, loading the CPU on power application or reset using a program in the ROM, identifying defective memory cells in the RAM using the program stored in the ROM each time the application specific integrated circuit is turned on or reset and virtually replacing the defective memory cells with patch memory cells when the CPU requests access to a defective memory cell, wherein the defective cells have addresses which are stored in trap and patch (T&P) logic circuits, the virtual replacements for the defective cells having addresses that am stored in associated T&P registers.

5. An integrated circuit comprising:

means for addressing and processing data based on program instructions, means operatively connected to the addressing and processing means for providing at least some program instructions to the addressing and processing means, a first volatile memory means operatively connected to the addressing and processing means for storing data at addresses accessible by the addressing and processing means, a second volatile memory means operatively connected to the addressing and processing means for virtually replacing defective parts of the first memory means by storing data at addresses, means for selectively connecting the first memory means and the second memory means to the addressing and processing means, the program instruction means having a program which identifies the defective parts in the first memory means and loads the connecting means with addresses of the defective parts and addresses of designated replacement parts in the second memory means each time the integrated circuit is turned on or reset, the connecting means intercepting address requests from the addressing and processing means directed to the defective parts, and directing the address requests to the designated replacement parts, wherein the first memory means is selectively connectable to the addressing and processing means through a first gate, and the connecting means is selectively connectable through a second gate, the connecting means controlling the first and second gates, whereby the connecting means directs address requests to designated replacement parts through control of the first and second gates, whereby the replacement of the defective parts is transparent to the addressing and processing means.

6. The circuit of claim 5 wherein the first memory means and the connecting means are selectively connectable to the addressing and processing means through a multiplexer, the connecting means controlling the multiplexer, whereby the connecting means directs address requests to the designated replacement parts through control of the multiplexer.

7. An integrated circuit comprising:

a central processing unit (CPU) having at least one address port for accessing memory addresses, at least one data input port and at least one data output port, a read only memory (TOM) having at least one address port connected to the CPU address port and at least one data output port connected to the CPU data input port, at least one random access memory (RAM) having a first plurality of memory cells for operating the integrated circuit, the first plurality of memory cells having at least one address port selectively connectable to the CPU address port, at least one data input port connected to the CPU data output port, and at least one data output port connected to the CPU data input port, the RAM also having a second plurality of memory cells for virtually replacing defective memory cells in the first plurality of memory cells, the second plurality of memory cells having at least one address port, at least one data input port, and at least one data output port connected to the CPU data input port, a plurality of trap and patch (T&P) logic circuits and registers having at least one address input port connected to the CPU address port, at least one address output port selectively connectable to the address port for the second plurality of memory cells, and at least one control port for selectively connecting the first plurality of memory cells and the second plurality of memory cells, the ROM having a program which identifies defective memory cells in the first plurality of memory cells and loads the T&P logic circuits and registers with addresses of the defective memory cells and addresses of designated replacement cells for the defective memory cells each time the integrated circuit is turned on or reset, the T&P logic circuits and registers intercepting address requests from the CPU directed to the defective memory cells, and directing the address requests to the designated replacement cells through control of the first and second gates, whereby the replacement of the defective cells is transparent to the CPU.

8. The circuit of claim 7 wherein the address port of the first plurality of memory cells is selectively connectable to the CPU address port through a first gate, and the address output port of the T&P logic circuits and registers are selectively connectable through a second gate, the control port controlling the first and second gates, whereby the T&P logic circuits and registers direct address requests to designated replacement cells through control of the first and second gates.

9. The circuit of claim 7 wherein the address port of the first plurality of memory cells and the address output port of the T&P logic circuits and registers are selectively connectable through a multiplexer, the control port controlling the multiplexer, whereby the T&P logic circuits and registers direct address requests to the designated replacement cells through control of the multiplexer.

* * * * *